Figure 1:
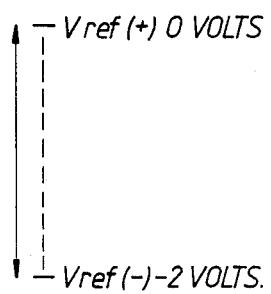

# United States Patent [19]

Mapleston

[11] Patent Number: 4,774,499
[45] Date of Patent: Sep. 27, 1988

[54] ANALOG TO DIGITAL CONVERTER

[75] Inventor: David B. Mapleston, Wiltshire, England

[73] Assignee: Plessey Overseas Limited, Ilford, England

[21] Appl. No.: 8,675

[22] Filed: Jan. 29, 1987

[30] Foreign Application Priority Data

Feb. 3, 1986 [GB] United Kingdom ............ 8602569

[51] Int. Cl.$^4$ .............................................. H03M 1/36
[52] U.S. Cl. .................................. 341/158; 324/99 D; 307/360; 307/361
[58] Field of Search ....... 340/347 AD, 347 M, 347 C; 324/99 D; 307/360, 361

[56] References Cited

U.S. PATENT DOCUMENTS 4,485,372 11/1984 Holloway ...................... 340/347 AD
4,571,574 2/1986 Krynicki ................. 340/347 DA X

FOREIGN PATENT DOCUMENTS 228620 4/1971 United Kingdom .
034140 5/1980 United Kingdom .
568576 6/1980 United Kingdom .
148638 5/1985 United Kingdom .

OTHER PUBLICATIONS

The Engineering Staff of Digital Equipment Corp., Analog-Digital Conversion Handbook, 1964, pp. 18-26.
Reddy, A-D Converter-A Threshold Logic Approach, Inst. J. Electronics, 1974, vol. 37, No. 3, pp. 365-368.

Primary Examiner—T. J. Sloyan
Attorney, Agent, or Firm—Michael F. Oglo; Julian C. Renfro

[57] ABSTRACT

A converter of the flash type includes means for amplifying and d.c. level shifting portions of the input analog waveform fed to each A to D converter unit to provide each converter unit with a full voltage input swing relative to the reference voltage for conversion, thereby producing a more accurate digital output.

4 Claims, 2 Drawing Sheets

ANALOG TO DIGITAL CONVERTER

The present invention relates to analogue to digital converters (ADC) and more particularly to increasing the accuracy of the digital output of conversion in flash converters.

Although an ADC may have an accuracy down to $\frac{1}{2}$ LSB (least significant bit) when used singularly its accuracy is reduced when used in a stacked system such as in known flash converters. This is because the reference voltage in a stack of N converters is reduced by a factor of 1 to accomodate a similar input swing as a single device.

It is an object of the present invention to provide an analogue to digital flash converter which has improved accuracy for a given accuracy of the individual A to D converters used.

The present invention provides an analogue to digital flash converter comprising a plurality of analogue to digital converter units and including prescaling means connected to receive and to amplify voltage defined portions of the input analogue waveform signal prior to conversion of the input analogue waveform signal into digital form.

Preferably the flash converter comprises N analogue to digital converter units and there are N linear amplifiers respectively connected thereto the input waveform being divided into N equal portions each amplifier having an amplification factor of N.

Preferably each amplifier is associated with d.c. level shifting means.

Figure 2:
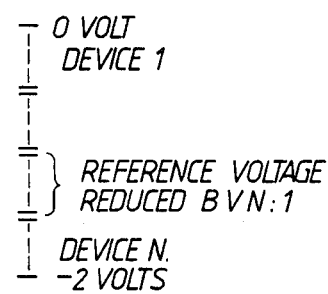
Figure 3:
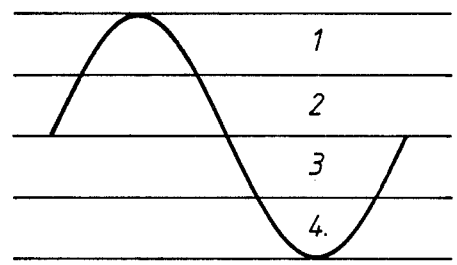
Figure 4:
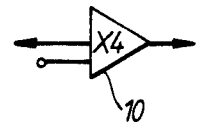
Figure 4:
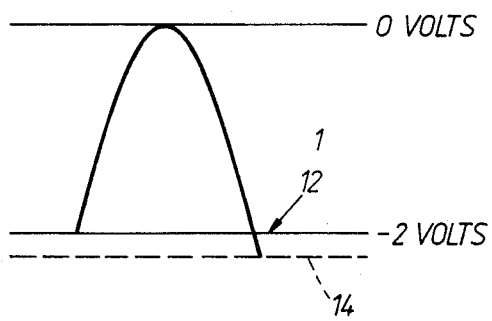
Figure 5:
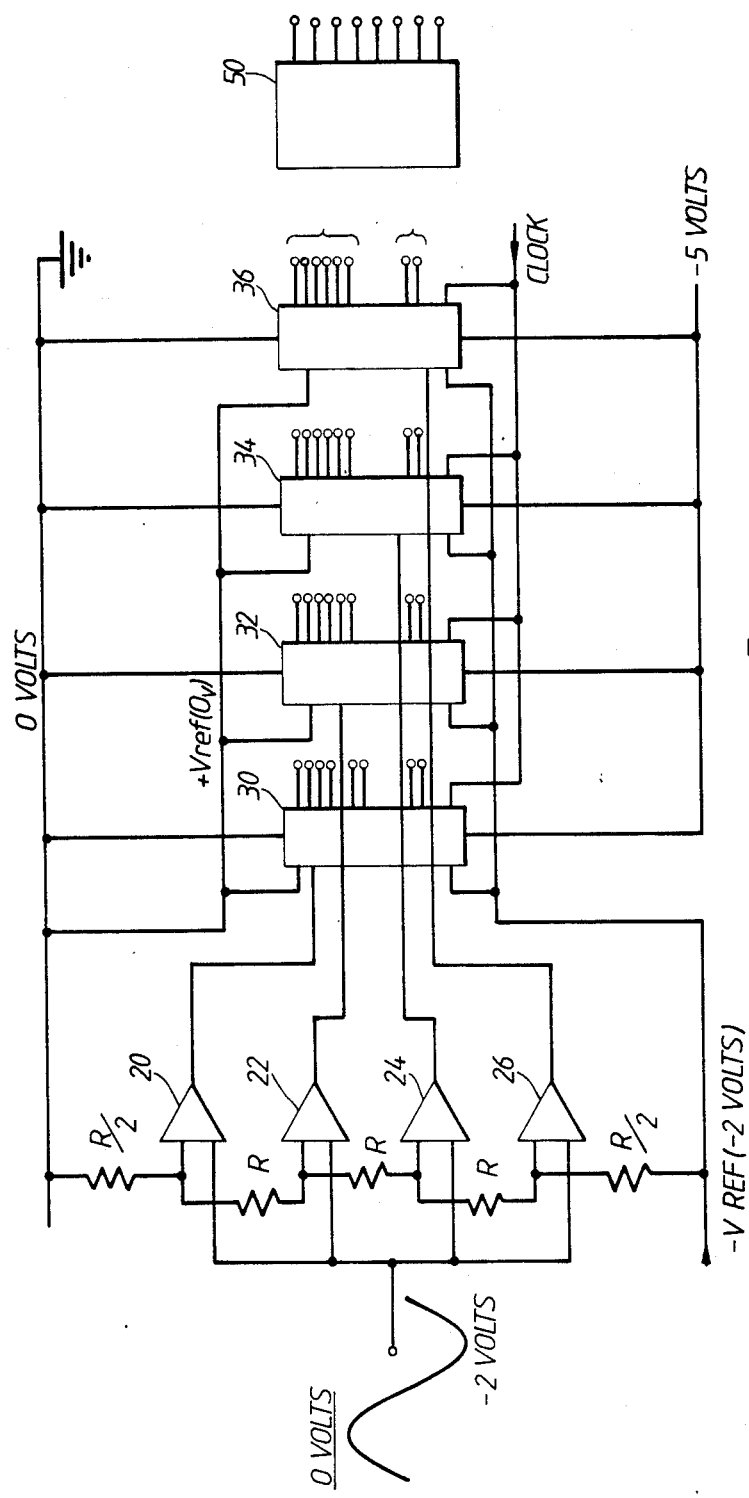

Embodiments of the present invention will now be described, by way of example with reference to the accompanying drawings, in which FIG. 1 illustrates the conversion by a known single ADC, FIG. 2 illustrates the conversion by a known stacked flash converter, FIG. 3 illustrates the method of conversion by a flash converter according to the present invention, FIG. 4 illustrates the output waveform of an input amplifier in the converter of the present invention and FIG. 5 illustrates block diagrammatically a flash converter according to the present invention.

With reference now to FIG. 1, in a single ADC the input voltage signal is fed to the ADC and is converted within the range of the reference voltage of the ADC. In FIG. 1 this is assumed by way of example only to be 2 volts (0 volts to $-2$ volts) and this is used for the remaining examples. Any suitable voltage may however be selected dependent on the design of the integrated circuit.

The accuracy of conversion of a 2 volt input waveform is therefore dependent on the design of the converter but an accuracy down to $\frac{1}{2}$ LSB (least significant bit) is readily obtainable.

With reference now to FIG. 2 for quicker A to D conversions flash converters are used, the individual ADC's being stacked and in the four stack system illustrated each converts only one quarter of the input voltage waveform. Thus the 2 volts reference voltage is only partially used and the accuracy of the conversion is therefore considerably lower.

With reference to FIG. 3 in the system according to the present invention the input waveform voltage is effectively divided into four equal voltage ranges e.g. $0_v$ to $-0.5_v$; $-0.5_v$ to $-1.0_v$; $-1.0_v$ to $-1.5_v$; and, $-1.5_v$ to $-2.0_v$, and voltage signal in each range is amplified $\times 4$ by a linear operational amplifier 10, the output of the amplifier being effectively d.c. level shifted to produce an output waveform between 0 and $-2$ volts as shown in FIG. 4. Whenever the input signal amplitude lies outside any particular one of these voltage ranges, the corresponding output waveform should be allowed to overshoot the voltage limits as shown at 12 in FIG. 4 in order to enable detection of any possible carry signal in the flash converter. Any such overshoot is preferably limited by a high speed diode clamp set at a suitable level as indicated by dotted line 14.

A practical embodiment is shown in FIG. 5 in which the input analogue waveform is fed to four matched-gain amplifiers 20, 22, 24, 26. Each amplifier is set to amplify and d.c. level shift a portion of the input waveform as described with reference to FIG. 3. As shown in FIG. 5 this is achieved by correcting each amplifier 20, 22, 24, and, 26 at its subtractive input to a corresponding tap that is taken off a voltage divider connected between the common reference voltage rail ($-2_v$) and the ground rail ($0_v$). This voltage divider is comprised of five resistors 40, 42, 44, 46, and, 48 which are connected in series and tapped at each resistor - resistor junction. It is noted that in this arrangement the three amplifier-to-amplifier connected resistors 42, 44, and 46 are of matched value R, whilst the rail - connected resistors 40 and 48 are of one half of this value, R/2. - i.e. they have resistance values that are in the ratio:- $\frac{1}{2}:1:1:1:\frac{1}{2}$, respectively. The tapped voltages, presented to the subtractive inputs of the amplifiers 20, 22, 24, and 26 are thus: $-0.25_v$; $-0.75_v$; $-1.25_v$; and, $-1.75_v$. It is noted that each of these tapped reference voltages lies precisely at midrange for each of the above mentioned equal voltage ranges: 0 to $-0.5_v$; $-0.5_v$ to $-1.0_v$; $-1.0_v$ to $-1.5_v$; and, $-1.5_v$ to $-2.0_v$. Consecutive tapped voltages thus differ by $-0.5_v$. Thus each amplifier 20, 22, 24, and 26 operates about the mid-point of its allocated range. For an input signal of amplitude in the range 0 to $-2_v$, one of the amplifiers 20, 22, 24 and 26 will produce a fourfold amplified and shifted signal lying within the range 0 to $-2_v$ of the following A to D converter unit 30, 32, 34, or, 36. With the provision of diode clamps, as described above, the output signal from each of the remaining three amplifiers, 22, 24, and 26; 20, 24, and 26; 20,22, and 26; or, 20, 22, and 24 will overshoot the output range of 0 to $-2$hd v and will be limited After this prescaling, the respective amplified outputs are fed to respective A to D converter units 30, 32, 34, 36 which provide digital outputs (6 binary+2 carry bits).

The outputs of each of the A to D converter units 30, 32, 34, 36 are fed to an encoder 50, a binary wired OR circuit, to produce an 8 bit digital output.

The binary output is more accurately coded than in previous systems because each A to D converter is effectively working across its maximum voltage with respect to the reference voltage.

EXAMPLE

As a specific example of the circuit of FIG. 5, a reference voltage of 0 V is applied to the upper voltage rail and a reference voltage of $-2$ V is applied to the lower voltage rail. The resistors R/2 have a value of 500 $\Omega$ and the resistors R have a value of 1 K$\Omega$, resulting in reference voltages being applied to the inverting inputs of amplifiers 20, 22, 24, 26 of $-0.25$ V, $-0.75$ V, $-1.25$ V and $-1.75$ V respectively. Amplifiers 20-26 are each of the type SL9999, a 400 MHz bandwidth ADC driver-amplifier. The outputs of amplifiers 20–26 are each connected to a respective one of analog to digital converters 30–36 which are each of the type SP9756 having a six-bit output accurate to $\pm\frac{1}{8}$ LSB with two carry outputs. The outputs lines of ADC's 30–36 are connected to unit 50, which comprises wired OR gates, each of the six-bit output lines of each ADC being coupled to a respective OR gate, and the carry outputs of each ADC being coupled to further OR gates. The outputs of the OR gates are coupled to a retiming latch type SP9210.

Each amplifier 20–26 is arranged to amplify an input signal voltage swing of 0.5 V by four to 2.0 V and to apply the output voltage swing suitably level shifted as a signal extending between 0 V and −2 V to the input of the respective amplifier 30–36. Thus amplifier 20 will amplify signals between 0 V and −0.5 V (centred about −0.25 V) to provide an appropriate input ot ADC 30. Amplifier 20 may amplify a wider input voltage swing as indicated in figure4 but this is not significant since the input voltage swing limits to ADC 30 will be preset. Similarly, amplifier 22, 24 and 26 amplify signal ranges of −0.5 V to −1.0 v, −1.0 V to −1.5 V and −1.5 V to −2.0 V respectively to produce output voltage swings of 0 to −2.0 V applied to ADC's 32, 34, 36.

By way of example, for an input voltage of −1.2 V, this signal applied to amplifier 20 will produce an input voltage differential of (−1.2 V −(−0.25 V))=0.95 V which when amplified ×4 and level shifted by −1 V provides an out of limits signal of =4.8 V to ADC 30, which provides an all 0 digital code with a carry signal on the carry outputs. Amplifier 22 experiences an input voltage of (−1.2 V −(−0.75 V))=−0.45 V which is amplified to −1.8 V and level shifted by −1 V to provide an out of limits signal of −2.8 V. Hence the output of ADC 32 is similarly all 0's with a carry signal.

For amplifier 24, an input voltage of (−1.2 V −(−1.25 V=+0.05 V produces an output voltage of 0.02 V which is level shifted by −1 V to −0.8 V to produce an output from ADC which is −0.8/−2.0=0.4 in six bit digital code.

For amplifier 26, an input voltage of (−1.2 V −(−1.75 V))=+0.55 V produces an output voltage of +2.2 V which is level shifted to +1.2 V. Thus being above the positive upper limit for ADC 36, ADC provides an all 0's output with no carry signal.

Hence the output provided by the wired OR gates in circuit 50 is two carry signals +0.4 in digital code i.e. 2.4 of a maximum of four carry signals, i.e. 2.4 : 4. Since the maximum of four carry signals is provided by an input voltage of −2 V, the code of 2.4 represents 2.4/4×(−2)=−1.2 V, which is the actual input applied.

Having described the invention and the manner in which it may be best performed, I claim:

1. An analogue to digital flash converter comprising: signal prescaling means, responsive to an analogue input signal, said means being such as to provide a set of analogue electrical signals, each such signal, within limits, being linearly dependant upon the voltage amplitude of said input signal, each thus related thereto by a common amplification factor and by a different d.c. voltage offset; a single-flash conversion stage comprised of: a set of like analogue to digital converter units, each unit having a set of binary outputs and at least one carry output, all units being configured in parallel and referred to a common reference voltage, and, each unit being co-operative with said prescaling means to receive a corresponding one of said electrical signals; and, signal encoding means, co-operative with the binary and carry outputs of each said unit, and to derive therefrom electrical digital signals indicative of the voltage amplitude of said input signal.

2. A flash converter, as claimed in claim 1, wherein said signal prescaling means is comprised of:
a set of linear operational amplifiers, each matched in gain, and, together equal in number to the number of said units; and,
offset voltage source means, co-operative with each said amplifier, to supply to the subtractive input thereof a different offset voltage.

3. A flash converter, as claimed in claim 2, wherein said source means comprises:
a voltage source, source of said common reference voltage; and,
a voltage divider referred to said source.

4. A flash converter, as claimed in claim 3, namely an 8-bit converter, wherein; the amplifiers and the units are each four in number; the amplifiers provide four-fold amplification; the units are capable of resolving 6-bits each; and, the voltage divider is comprised of five resistance elements connected in series, the resistance values of which are in a ratio of:$\frac{1}{2}$:1:1:1:$\frac{1}{2}$, respectively.

* * * * *